United States Patent
Kim et al.

(10) Patent No.: US 8,412,116 B1
(45) Date of Patent: Apr. 2, 2013

(54) WIRELESS TRANSCEIVER

(75) Inventors: Beomsup Kim, Cupertino, CA (US); Cormac S. Conroy, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 475 days.

(21) Appl. No.: 10/325,716

(22) Filed: Dec. 20, 2002

(51) Int. Cl.
*H04B 1/38* (2006.01)

(52) U.S. Cl. ............ 455/73; 455/86; 375/219; 375/306; 375/327

(58) Field of Classification Search .................... 455/73, 455/83, 86; 370/278, 282; 375/219, 273, 375/279–283, 308, 324, 327–331, 340
See application file for complete search history.

(56) References Cited

U.S. PATENT DOCUMENTS

| | | | | | |
|---|---|---|---|---|---|
| 4,745,371 | A | * | 5/1988 | Haine | 331/1 A |
| 5,515,364 | A | * | 5/1996 | Fague | 370/278 |
| 5,926,466 | A | * | 7/1999 | Ishida et al. | 370/280 |
| 6,157,271 | A | * | 12/2000 | Black et al. | 332/127 |
| 6,407,629 | B1 | * | 6/2002 | Burri et al. | 329/347 |
| 6,452,909 | B1 | * | 9/2002 | Bauer | 370/280 |
| 6,696,897 | B1 | * | 2/2004 | Kong et al. | 331/45 |
| 6,728,517 | B2 | * | 4/2004 | Sugar et al. | 455/73 |
| 6,961,399 | B2 | * | 11/2005 | Lee | 375/376 |
| 2003/0176173 | A1 | * | 9/2003 | Klemmer | 455/182.2 |

* cited by examiner

*Primary Examiner* — Raymond Dean
(74) *Attorney, Agent, or Firm* — Ramin Mobarhan

(57) ABSTRACT

A system and method are disclosed for transmitting and receiving signals. The method includes receiving a received signal; demodulating the received signal by mixing the received signal with a receiver local oscillator signal generated by a voltage controlled oscillator configured to generate the receiver local oscillator signal; switching the configuration of the voltage controlled oscillator to generate a transmission signal for use by a transmitter; and transmitting a modulated signal derived from the transmission signal.

17 Claims, 8 Drawing Sheets

WIRELESS TRANSCEIVER

CROSS REFERENCE TO RELATED APPLICATIONS

This application is related to co-pending U.S. patent application Ser. No. 10/219,057 by Conroy et al. filed Aug. 14, 2002 entitled "Multiplexed ADC for a Digital Cellular Transceiver", which is incorporated herein by reference for all purposes.

FIELD OF THE INVENTION

The present invention relates generally to communication systems. More specifically, a transceiver design is disclosed.

BACKGROUND OF THE INVENTION

In modern communication systems, transmitting a signal commonly involves mixing the signal with another signal of a given frequency and phase in order to modulate the signal to be transmitted. Similarly, the demodulation of a received signal also usually involves mixing the signal with another signal of a given frequency and phase. Previously, transmitters and receivers were discrete components. With improvements in IC (integrated circuit) technology, today there are various transceivers that combine the transmit and receive functions into one device.

FIG. 1 is a block diagram illustrating a transceiver. Receiver 100 receives a signal that is filtered by filter 105, and mixed by mixer 107 with a signal generated by LO (local oscillator) 120. The LO includes a TCXO (temperature controlled crystal oscillator) 130 and a PLL (phase locked loop) 135. The resulting signal is filtered by filter 170 and mixed by mixer 165 with another signal generated by LO 160 for further demodulation. LO 160 includes a TCXO 150 and a PLL 155. The demodulated baseband signal is sent to other parts of the device for further processing. In some embodiments, LO 120 and LO 160 share the same TCXO.

In transmitter 102, an input signal is filtered by filter 108, and mixed by mixer 109 with a signal generated by LO 122. The LO includes a TCXO 132 and a PLL 137. The signal generated by the LO is used to modulate the baseband signal. The IF modulated signal is filtered and mixed by mixer 167 with a signal generated by LO 162. LO 162 includes TCXO 152 and PLL 157. The RF modulated signal is amplified by power amplifier (PA) 169 and then transmitted.

Generally, it is desirable to design transceivers with as few components as possible to improve power consumption and reduce size. It would be useful if a smaller, more efficient transceiver could be developed.

BRIEF DESCRIPTION OF THE DRAWINGS

The present invention will be readily understood by the following detailed description in conjunction with the accompanying drawings, wherein like reference numerals designate like structural elements, and in which:

FIG. 5 illustrates a transceiver embodiment that combines the receiver shown in

FIG. 3 and the transmitter shown in FIG. 4.

DETAILED DESCRIPTION

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

An improved transceiver design is disclosed. In a time division multiplexing (TDM) environment (e.g. GSM, TDMA, PHS, PDC), the transmit and receive operations are interleaved in time. The transmitter and the receiver of the transceiver are not active at the same time. Thus, components may be shared between the transmitter and the receiver if they can be reconfigured to perform the appropriate required functions within the time that the transceiver switches between transmit and receive mode. In one embodiment, the transmitter and the receiver of the transceiver share a complete LO. In one embodiment, the transmitter and the receiver share only the voltage controlled oscillator (VCO) portion of the LO circuitry. In one embodiment, the transmitter and the receiver share an analog to digital converter (ADC). In various embodiments, the transmitter and the receiver may share any combination of VCO, LO and ADC.

Figure 1:
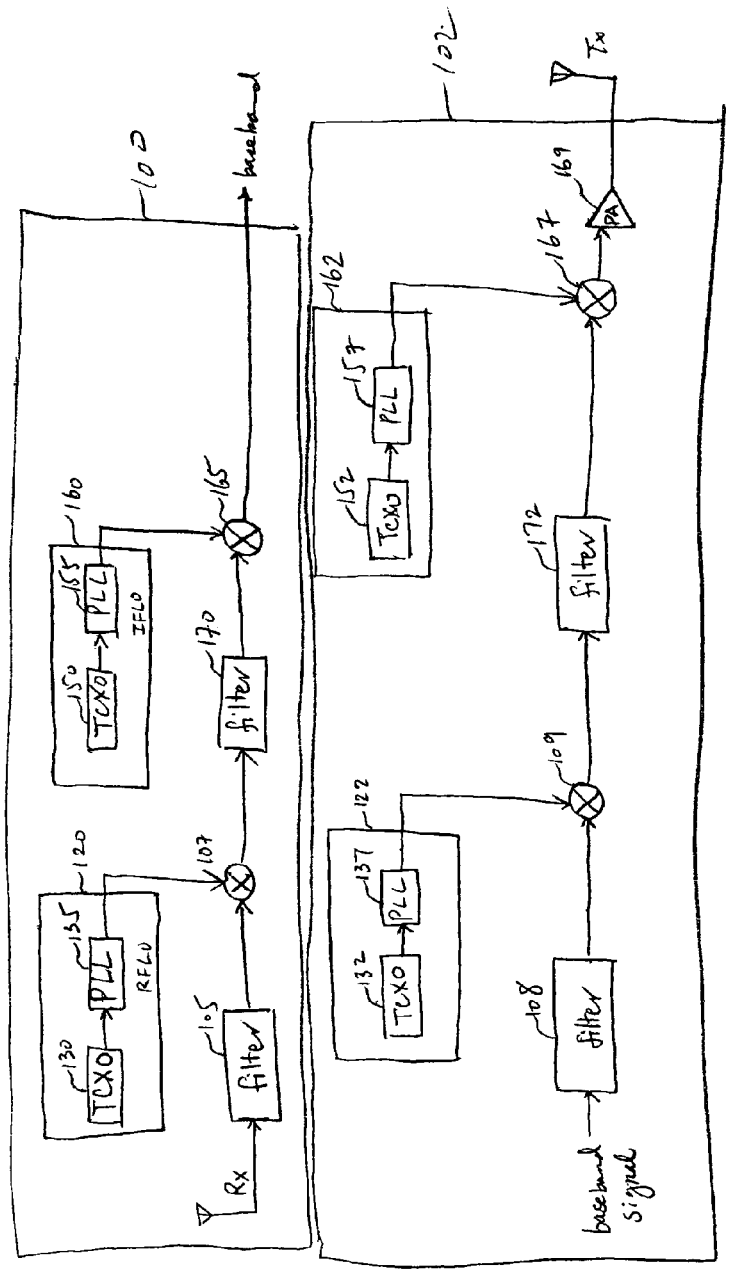
FIG. 1 is a block diagram illustrating a transceiver.
Figure 2:
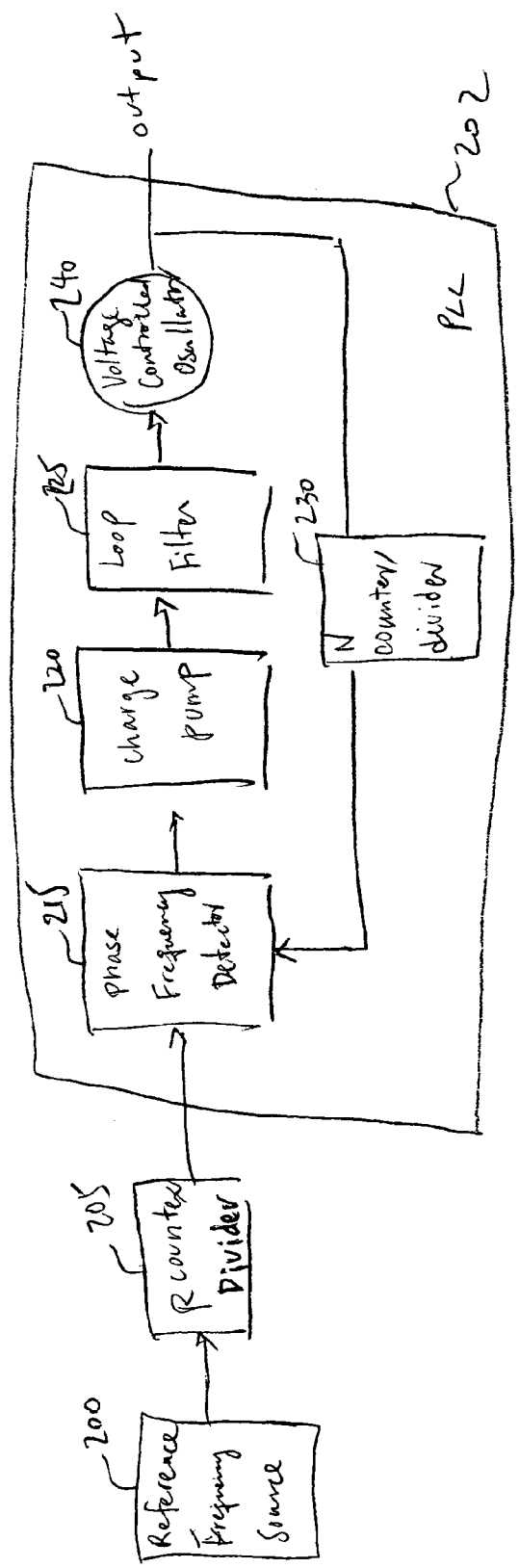
FIG. 2 is a block diagram illustrating the operation of a local oscillator (LO).

FIG. 2 is a block diagram illustrating the operation of an LO. Phase locked loop (PLL) 202 is a feedback control system that controls the phase of a voltage controlled oscillator (VCO). A stable reference frequency is generated by frequency reference source 200. Examples of such reference source include a temperature compensated crystal oscillator (TCXO) and a voltage controlled temperature compensated crystal oscillator (VC-TCXO). The reference frequency is divided by R using R counter 205. The divided frequency is one input into phase frequency detector (PFD) 215, while the other input into the PFD is the output signal divided by N using N counter 230. The output of the PFD is a voltage proportional to the phase difference between the two inputs. This signal is sent to charge pump (CP) 220 then applied to loop filter (LPF) 225. The filtered signal is sent to voltage controlled oscillator (VCO) 240, which generates the output.

Generally, for a given LO, the R value is fixed, and the N value (also referred to as the PLL's divide ratio) is adjustable. By adjusting the values for N, the voltage applied to VCO changes and the VCO's output frequency also changes. Thus, the PLL can be configured to generate different frequencies. Depending on the type of values allowed for N, the PLL may be categorized as an integer N PLL or a fractional N PLL. The output of the PLL is the same as the output of the LO.

For the purpose of illustration, transceiver designs specific to Gaussian minimum shift key (GMSK) modulation are discussed in detail. It should be noted that the architecture and methods described are also applicable to other modulation schemes. In the following embodiment where a transceiver design has a shared LO, the transmitter and receiver designs are first discussed separately, and then combined to illustrate the transceiver design.

Figure 3:
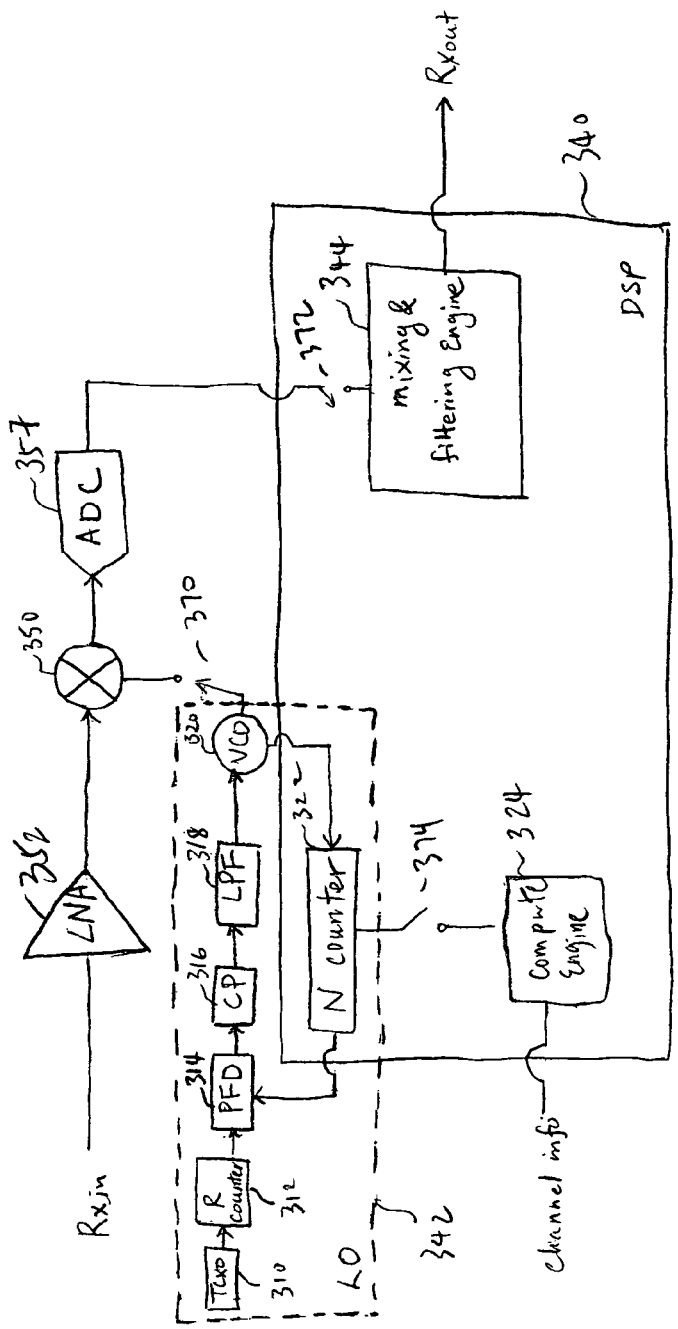
FIG. 3 is a block diagram illustrating the receiver portion of a transceiver design that shares an LO with a transmitter according to the present invention.

FIG. 3 is a block diagram illustrating the receiver portion of a transceiver design that shares an LO with a transmitter, according to the present invention. In this embodiment, all switches 370, 372 and 374 are closed during the receive cycle and opened during the transmit cycle, i.e., the paths through the switches are connected during the receive cycle and blocked during the transmit cycle. During the receive cycle, the received signal is amplified by LNA 352 and then demodulated by mixing with a receiver LO signal using mixer 350. LO 342 outputs the receiver LO signal using its VCO. The components of LO 342 include TCXO 310, R counter 312, PFD 314, CP 316, LPF 318, VCO 320 and N counter 322. N counter 322 is a part of digital signal processor (DSP) 340. Compute engine 324 computes an appropriate N value based on the channel information pertaining to the received signal. This computed N value is stored in the N counter, and is used for the generation of an appropriate receiver LO signal by LO 342.

The demodulated signal is applied to ADC 357, which converts the demodulated signal to digital. The digitized signal is sent to a mixing and filtering engine 344 that belongs to DSP 340. The mixing and filtering engine numerically mixes the input signal with a fixed LO frequency to further demodulate the input. The resulting signal is filtered and sent to the output interface, to be used by other parts of the device.

Figure 4:
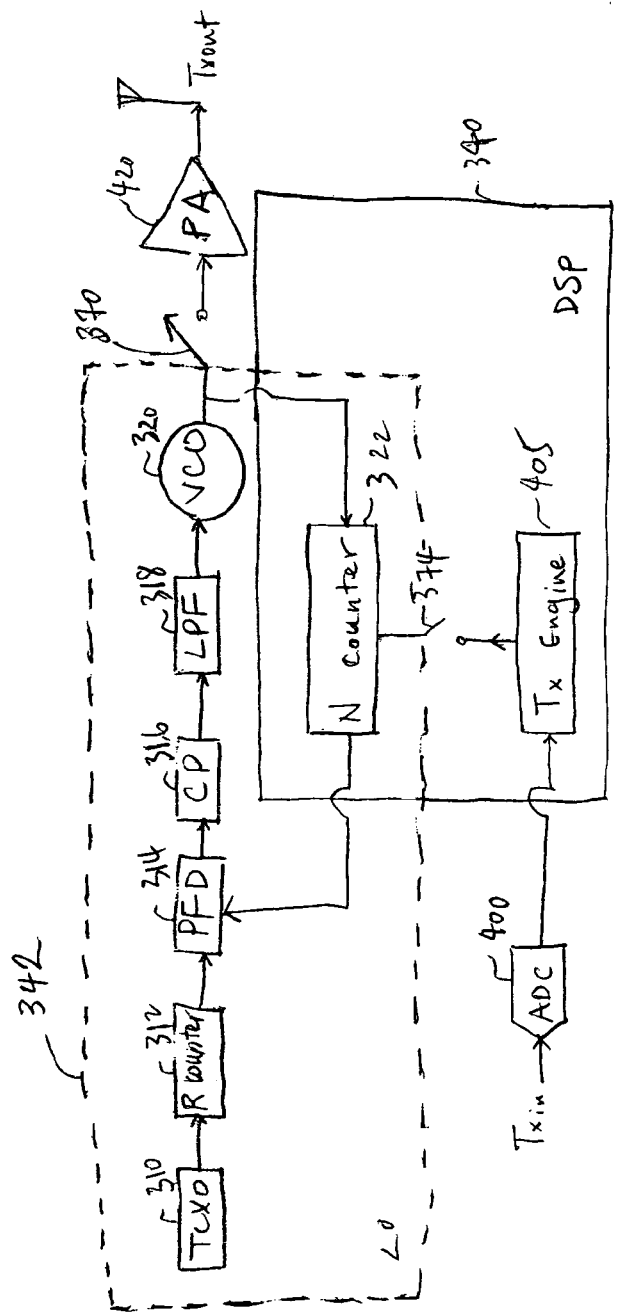
FIG. 4 is a block diagram illustrating the transmitter portion of a transceiver design that shares an LO with the receiver according to the present invention.

FIG. 4 is a block diagram illustrating the transmitter portion of a transceiver design that shares an LO with the receiver portion, according to the present invention. In this embodiment, DSP 340 is the same DSP that is used in the receiver shown in FIG. 3. LO 342 and its associated components (TCXO 310, R counter 312, PFD 314, CP 316, LPF 318, VCO 320 and N counter 322) are shared with the receiver as well. Some of the components, such as the LPF, are programmable. These components are often programmed to take on distinct sets of values depending on whether the transceiver is in transmit mode or receive mode.

During the transmit cycle, switches 370 and 374 both disconnect from the components they are connected to during the receive cycle. Switch 370 connects to PA 420 and switch 374 connects to transmit engine 405. The input signal is converted to digital by ADC 400, and then sent to the transmit engine 405 of DSP 340. In this embodiment, a modified fractional N PLL is used to directly modulate the signal to be transmitted. DSP 340 controls transmit engine 405, which computes and reprograms the value of N stored in N counter 322 over time. As the PLL's divide ratio N changes, the output of VCO 320 changes, producing a transmission signal that is directly modulated.

In this embodiment, the modulation scheme used is GMSK. The PLL's divide ratio is dithered between N and N+1 to achieve the effect of direct modulation. In some embodiments, the PLL employs a multi-modulus divider that chooses the PLL's divide ratio from more than two values. For example, the PLL chooses from four divider values, N, N+1, N+2 and N+3 in one embodiment. The dithering changes the divide ratio of the PLL in a time varying manner that changes the frequency and phase of the VCO output over time. The output signal is frequency and phase modulated according to GMSK. In this embodiment, the direct modulation scheme produces a constant envelope signal that has frequency and phase variations but no maximum amplitude changes. In some embodiments, the transmit engine is connected to power amplifier 420 to vary the amount of amplification for the signal to be transmitted. As a result, the direct modulation scheme produces a non-constant envelope signal. Because the transmission signal output by the VCO is directly modulated, it is not necessary to modulate the signal any further. The modulated signal in this case is the transmission signal. It is amplified by PA 420 and transmitted.

In some embodiments where other modulation techniques are used, the transmission signal produced by VCO 320 may be a transmitter local oscillator signal used for modulation. The transmitter then derives a modulated signal from the transmission signal and amplifies it for output.

In the embodiment shown above, the transmit input signal is analog because the signal comes from an external source, such as a baseband modem, that produces an analog output. Thus, the input signal of the transmitter is converted to digital by ADC 400. In other embodiments, the external source produces a transmit signal that is digital.

Figure 5:
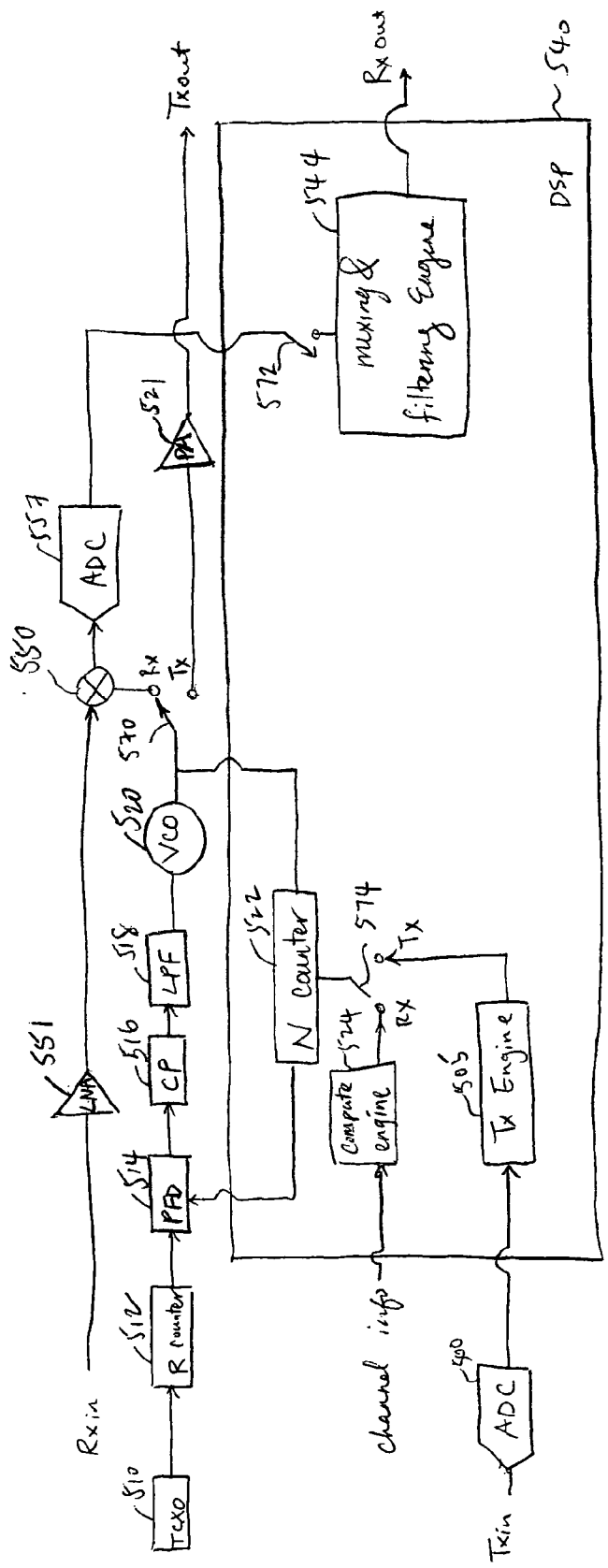

FIG. 5 illustrates a transceiver embodiment that combines the receiver shown in FIG. 3 and the transmitter shown in FIG. 4. In this embodiment, the transmitter and the receiver of the transceiver share an LO. Switches 570 and 574 connect to the points labeled Rx during the receive cycle, and the points labeled Tx during the transmit cycle. Switch 572 is closed during the receive cycle and opened during the transmit cycle.

During the receive cycle, the received signal is amplified by LNA 551 and then demodulated by mixing with a receiver LO signal using mixer 550. The receiver LO signal is generated by an LO that includes TCXO 510, R counter 512, PFD 514, CP 516, LPF 518, VCO 520 and N counter 522. N counter 522 is a part of digital signal processor (DSP) 540. Compute engine 524 computes an appropriate N value using the channel information pertaining to the received signal. This computed N value is stored in the N counter, and it leads to the generation of an appropriate receiver LO signal by the LO.

The demodulated signal is applied to ADC 557, which converts the signal to digital. The digitized signal is sent to a mixing and filtering engine 544 that belongs to DSP 540. The mixing and filtering engine numerically mixes the input signal with a fixed LO frequency to further demodulate the input to baseband. The resulting signal is filtered is sent to the output interface, to be used by other parts of the device.

During the transmit cycle, switch 570 connects to PA 521 and switch 574 connects to transmit engine 505. The baseband signal is converted to digital by ADC 500, and then sent to the transmit engine 505 of DSP 540. In this embodiment, a modified fractional N PLL is used to directly modulate the signal to be transmitted. DSP 540 controls transmit engine 505, which computes and varies the value of N stored in N counter 522 over time. As the PLL's divide ratio N changes, the output of the PLL is modulated.

Figure 6:
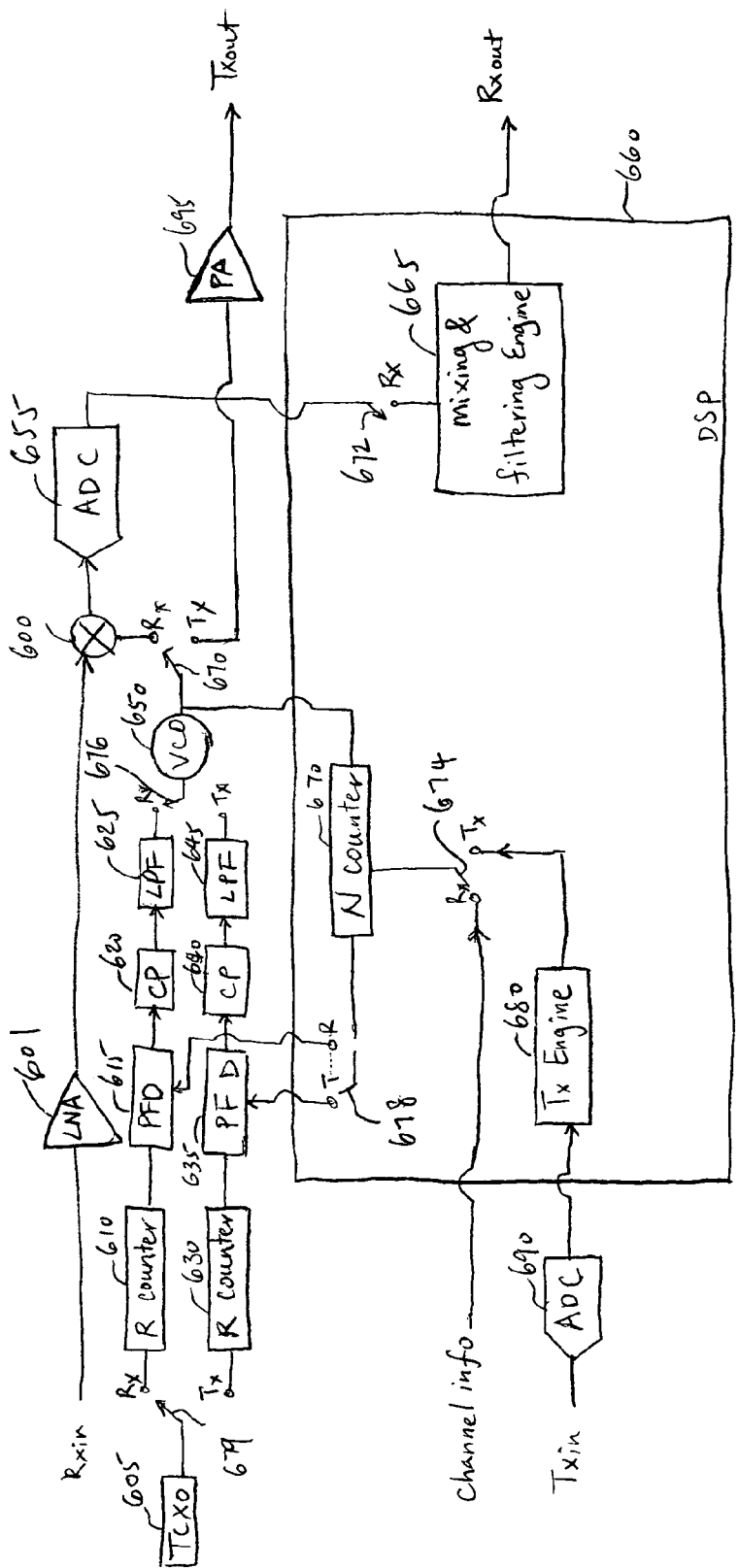
FIG. 6 is a block diagram illustrating one embodiment of a time division multiplex (TDM) transceiver design according to the present invention, where a voltage controlled oscillator (VCO) is shared between the transmitter and receiver and other LO components are not shared.

Under certain conditions, the transmitter and receiver requirements are different enough to preclude the sharing of the same LO. For instance, the transmitter's LO may need to have a wider frequency range than that of the receiver. It is still possible to reuse the various parts of the LO without completely duplicating the circuitry. FIG. 6 is a block diagram illustrating one embodiment of a TDM transceiver design according to the present invention, where a VCO is shared between the transmitter and receiver and other LO components are not shared.

During the receive cycle, switches 670, 674, 676, 678 and 679 connect to the points labeled Rx. Switch 672 is closed. The received signal is amplified by LNA 601 and then demodulated by mixing with a receiver LO signal using mixer 600. The receiver LO signal is generated by an LO that includes TCXO 605, R counter 610, PFD 615, CP 620, LPF 625, VCO 650 and N counter 670. N counter 670 is included in DSP 660 in the embodiment shown, but may be external to the DSP in some embodiments. The DSP computes an appropriate N value for the required LO frequency. This computed N value is stored in the N counter, and leads to the generation of an appropriate receiver LO signal by the LO.

The demodulated signal is applied to ADC 655, which converts the signal to digital. The digitized signal is sent to a mixing and filtering engine 665 that is included in DSP 660. The mixing and filtering engine numerically mixes the input signal with a fixed LO frequency to further demodulate the input to baseband. The resulting signal is filtered and output to other parts of the device.

During the transmit cycle, switches 670, 674, 676, 678 and 679 connect to points labeled Tx. Switch 672 is open. The baseband signal is converted to digital by ADC 690, and then sent to the transmit engine 680 of DSP 660. In this embodiment, a modified fractional N PLL is used to directly modulate the signal to be transmitted. DSP 660 controls transmit engine 680, which computes and varies the value of N stored in N counter 670 over time. As the PLL's divide ratio N changes, the frequency and phase of the VCO's output changes, generating the modulated signal. In one embodiment where the modulation scheme used is GMSK, the PLL's divide ratio is dithered between N and N+1. The output of VCO 650 is amplified by PA 695 before it is transmitted.

Figure 7:
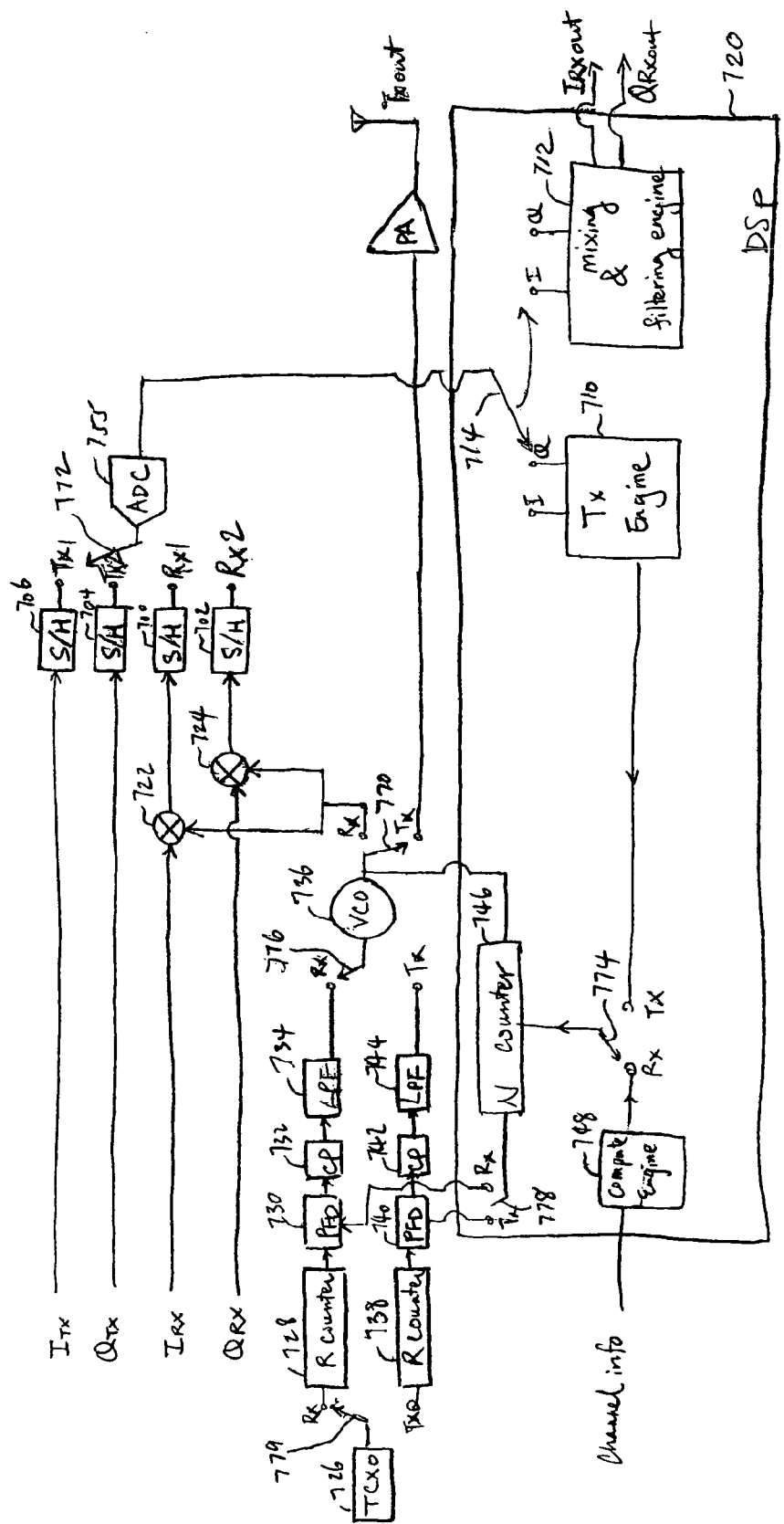
FIG. 7 is a block diagram illustrating a transceiver according to the present invention, with shared VCO and time multiplexed ADC.

The above described techniques can also be combined with the time multiplexed ADC design disclosed in Conroy, et al., which was previously incorporated by reference. FIG. 7 is a block diagram illustrating a transceiver according to the present invention, with shared VCO and time multiplexed ADC. The inputs are split into two components for easier processing: the in phase component (I) and the quadrature component (Q). $I_{Rx}$ and $Q_{Rx}$ are the I and Q components of the received signal. $I_{Tx}$ and $Q_{Tx}$ are the I and Q components of the signal to be transmitted. The shared ADC 755 is capable of multiplexing between the transmit and receive cycle, as well as toggling between the I and Q components to convert the signals to digital.

During the receive cycle, switches 770, 774, 776, 778, 779 are connected to the points labeled Rx. Switch 772 toggles between points Rx1 and Rx2. Switch 714 toggles between the I and Q inputs of mixing and filtering engine 712. The $I_{RXx}$ and $Q_{RX}$ components are each demodulated by mixing with a receiver LO signal, using mixers 722 and 724. The receiver LO signal is generated by an LO that includes TCXO 726, R counter 728, PFD 730, CP 732, LPF 734, VCO 736 and N counter 746. Compute engine 748 computes the value for N based upon the channel information input.

The sample and hold modules (S/H) 700 and 702 sample the demodulated $I_{Rx}$ and $Q_{RX}$ signals simultaneously. S/H 702 holds the value of $Q_{Rx}$ component with a time delay. ADC 755 toggles between the outputs of S/H 700 and S/H 702 to generate a data sequence that interleaves digitized $I_{Rx}$ and $Q_{Rx}$ values. The ADC output is sent to DSP 720, which recovers the I and Q components from the data sequence by using a timed switch 714 that selectively sends the signal to either the I or the Q inputs of an IF mixing and filtering engine 712. The mixing and filtering engine further demodulates, filters and outputs the signals.

During the transmit cycle, switches 770, 774, 776, 778, 779 are connected to the points labeled Tx. Switch 772 toggles between points Tx1 and Tx2. Switch 714 toggles between the I and Q inputs of transmit engine 710. The sample and hold modules (S/H) 704 and 706 sample the demodulated $I_{Tx}$ and $Q_{Tx}$ signals simultaneously. S/H 704 holds the value of $Q_{Tx}$ component with a time delay. ADC 755 toggles between the outputs of S/H 704 and S/H 706 to generate a data sequence that interleaves digitized $I_{Tx}$ and $Q_{Tx}$ values. The ADC output is sent to DSP 720 which recovers the digitized samples of the I and Q components. The recovery is done by using a timed switch 714 that selectively directs the data sequence to either the I or the Q inputs of a transmit engine 710. Based on its inputs, the transmit engine computes and varies the value of N stored in N counter 746 over time. In this embodiment, N counter 746, TCXO 736, R counter 738, PFD 740, CP 742, LPF 744 and VCO 736 comprise a local oscillator that has a modified fractional N PLL, used to directly modulate the inputs. Output of VCO 736 is applied to PA 759 before transmitted.

Figure 8:
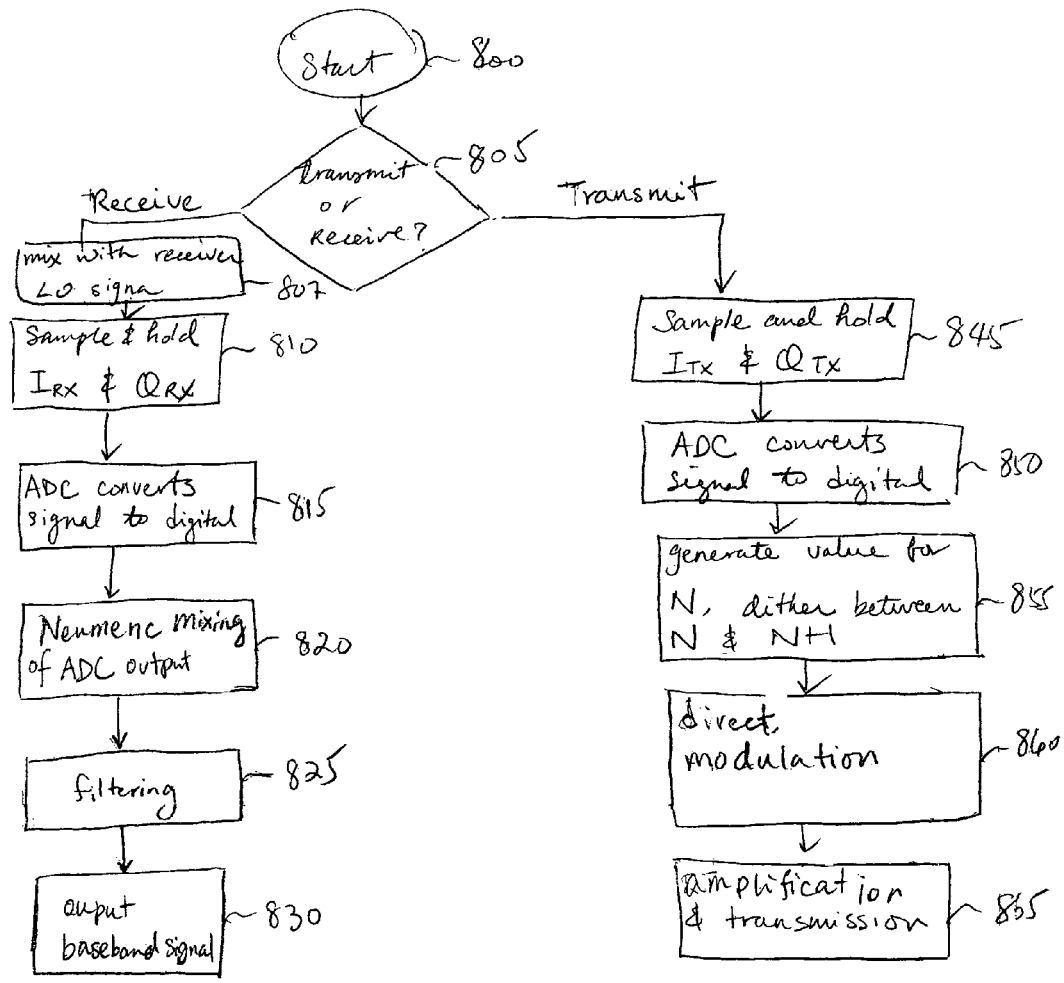
FIG. 8 is a flowchart illustrating a process whereby a transceiver transmits and receives signals according to the present invention.

FIG. 8 is a flowchart illustrating a process whereby a transceiver transmits and receives signals, according to the present invention. The flowchart starts at step 800. At step 805, it is determined whether the transceiver is to transmit or receive a signal. If it is in receive mode, flow control is transferred to step 810, where the $I_{Rx}$ and $Q_{Rx}$ signals are mixed with the receiver LO signal and demodulated. In step 810, the sample and hold modules process the demodulated signals. In step 815, the ADC converts the analog signals to digital. In step 820, output of the ADC is numerically mixed and further demodulated to baseband. In step 825, the demodulated signal is filtered. In step 830, the baseband signal is output.

If the transceiver is in a transmit cycle, then control is transferred from step 805 to step 845, where the sample and hold modules process $I_{Tx}$ and $Q_{Tx}$ signals. In step 850, the ADC converts the signal to digital. In step 855, the DSP and its modulator generates a value for N, and dithers the value in N counter between N and N+1. In step 860, the output from the ADC is directly modulated by the PLL. In step 865, the modulated signal is amplified and transmitted.

A transceiver design for a TDM system has been disclosed. The transceiver reuses components in its transmitter and receiver. The VCO, LO and/or ADC are shared in various embodiments as well as a DSP. In certain embodiments, the transmitter uses direct modulation technique for modulating the signal to be transmitted. Smaller and cheaper transceivers are produced using the techniques disclosed.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method for transmitting and receiving signals in a communication system comprising:
receiving a received signal, wherein the received signal is split into an in phase (I) component and a quadrature (Q) component;
configuring a local oscillator to generate a receiver local oscillator signal, the local oscillator including a phase locked loop (PLL) having a divide ratio controlled by a divider and a voltage controlled oscillator having an output that changes in response to changes in the divide ratio, said configuring further comprising controlling the divider to generate a receive divide ratio in response to channel information pertaining to the received signal;
demodulating the I and Q components of the received signal by mixing each of the components of the received signal with the receiver local oscillator signal;
sampling the demodulated I and Q components simultaneously;
delaying one of the Q component and the I component from the other by a time delay and interleaving, according to the time delay, the sampled demodulated I and Q components into a received data sequence;
switching the configuration of the local oscillator to generate a transmission signal for use by a transmitter, wherein switching comprises switching at least one port of the local oscillator from a receive path to a directly modulated transmit path including switching an input port of the divider from a receive path including the channel information pertaining to the received signal to a transmit path including a digitized transmit input signal;
generating a directly modulated transmission signal at the output of the voltage controlled oscillator by changing the divide ratio of the PLL in response to the digitized transmit input signal; and
transmitting the directly modulated transmission signal.

2. A method for transmitting and receiving signals as recited in claim 1 wherein the communication system is a time division multiplexing system.

3. A method for transmitting and receiving signals as recited in claim 1 wherein the communication system uses a modulation scheme that has a constant envelope.

4. A method for transmitting and receiving signals as recited in claim 1 wherein the communication system uses a modulation scheme that has a non-constant envelope.

5. A method for transmitting and receiving signals as recited in claim 1 wherein the communication system uses Gaussian minimum shift key modulation.

6. A method for transmitting and receiving signals as recited in claim 1 wherein the modulated signal is derived from an analog transmit signal and further including converting the demodulated receive signal to a digital receive signal and converting the analog transmit signal to the digitized input signal using a multiplexed analog to digital converter (ADC).

7. A method for transmitting and receiving signals as recited in claim 1 wherein the modulated signal is derived from an analog transmit signal and further including converting the demodulated receive signal to a digital receive signal and converting the analog transmit signal to the digitized input signal using a multiplexed ADC wherein the analog transmit signal and the analog receive signal are split into I and Q components.

8. A transceiver comprising:
a receiver configured to demodulate a received signal by using a receiver local oscillator signal, wherein the received signal is split into an in phase (I) component and a quadrature (Q) component;
a transmitter configured to transmit a directly modulated transmission signal; and
a local oscillator configured to generate the receiver local oscillator signal and the directly modulated transmission signal, the local oscillator including:
a phase locked loop (PLL) having a divide ratio controlled by a divider,
a voltage controlled oscillator having an output that changes in response to changes in the divide ratio, wherein, in a receive mode, the divider is operative to generate a receive divide ratio in response to channel information pertaining to the received signal and, in a transmit mode, to change the divide ratio in response to a digitized transmit input signal such that the voltage controlled oscillator outputs a directly modulated transmission signal;
a network of switches configured to selectively connect the receiver to the local oscillator in the receive mode and to connect the transmitter to the local oscillator in the transmit mode, wherein at least one switch of the network of switches is for toggling a port of the local oscillator between a receive path and a directly modulated transmit path and at least one other switch of the network of switches is for toggling an input port of the divider between the receive path including the channel information pertaining to the received signal and the transmit path including the digitized transmit input signal;
one or more mixers configured demodulate the I and Q components of the received signal;
one or more samplers configured to sample the demodulated I and Q components simultaneously; and
a delayer configured to delay one of the Q component and the I component from the other by a time delay and to interleave according to the time delay the sampled demodulated I and Q components into a received data sequence.

9. A transceiver as recited in claim 8 wherein the transceiver is used in a communication system; and the communication system is a time division multiplexing system.

10. A transceiver as recited in claim 8 wherein the transceiver is used in a communication system; and the communication system uses a modulation scheme that has a constant envelope.

11. A transceiver as recited in claim 8 wherein the transceiver is used in a communication system; and the communication system uses a modulation scheme that has a non-constant envelope.

12. A transceiver as recited in claim 8 wherein the transceiver is used in a communication system; and the communication system uses Gaussian minimum shift key modulation.

13. A transceiver as recited in claim 8 wherein the voltage controlled oscillator is a part of the local oscillator configured to generate the receiver local oscillator signal and to switch configuration to generate the transmission signal for use by the transmitter.

14. A transceiver as recited in claim 8 wherein the voltage controlled oscillator is a part of a local oscillator configured to generate the receiver local oscillator signal and to switch configuration to generate the transmission signal by reprogramming a counter included in the local oscillator.

15. A transceiver as recited in claim 8 wherein:
the modulated signal is derived from an analog transmit signal; and
the demodulated receive signal is converted to a digital receive signal and the analog transmit signal is converted to the digitized input signal using a multiplexed analog to digital converter (ADC).

16. A transceiver as recited in claim 8 wherein:
the modulated signal is derived from an analog transmit signal; and
the demodulated receive signal is converted to a digital receive signal and the analog transmit signal is converted to the digitized input signal using a multiplexed analog to digital converter (ADC); wherein the analog transmit signal and the analog receive signal are split into I and Q components.

17. A transceiver comprising:
means for receiving a received signal, wherein the received signal is split into an in phase (I) component and a quadrature (Q) component;
means for configuring a local oscillator to generate a receiver local oscillator signal, the local oscillator including a phase locked loop (PLL) having a divide ratio controlled by a divider and a voltage controlled oscillator having an output that changes in response to changes in the divide ratio, said configuring further comprising controlling the divider to generate a receive divide ratio in response to channel information pertaining to the received signal;
means for demodulating the I and Q components of the received signal by mixing each of the components of the received signal with the receiver local oscillator signal;
means for sampling the demodulated I and Q components simultaneously;
means for delaying one of the Q component and the I component from the other by a time delay and interleaving, according to the time delay, the sampled demodulated I and Q components into a received data sequence;
means for switching the configuration of the local oscillator to generate a transmission signal for use by a transmitter, wherein switching comprises switching at least one port of the local oscillator from a receive path to a directly modulated transmit path including switching an input port of the divider from a receive path including the channel information pertaining to the received signal to a transmit path including a digitized transmit input signal;
means for generating a directly modulated transmission signal at the output of the voltage controlled oscillator by changing the divide ratio of the PLL in response to the digitized transmit input signal; and
means for transmitting the directly modulated transmission signal.

\* \* \* \* \*